US012584223B2

(12) United States Patent
Mitrovic et al.

(10) Patent No.: US 12,584,223 B2
(45) Date of Patent: Mar. 24, 2026

(54) CHEMICAL VAPOR DEPOSITION APPARATUS WITH MULTI-ZONE INJECTION BLOCK

(71) Applicant: Veeco Instruments Inc., Plainview, NY (US)

(72) Inventors: Bojan Mitrovic, Somerset, NJ (US); Ian Kunsch, Somerset, NJ (US); Juan Gamarra, Morristown, NJ (US); Mandar Deshpande, Bridgewater, NJ (US)

(73) Assignee: VEECO INSTRUMENTS INC., Plainview, NY (US)

( * ) Notice: Subject to any disclaimer, the term of this patent is extended or adjusted under 35 U.S.C. 154(b) by 140 days.

(21) Appl. No.: 16/383,321

(22) Filed: Apr. 12, 2019

(65) Prior Publication Data

US 2019/0316258 A1     Oct. 17, 2019

Related U.S. Application Data

(60) Provisional application No. 62/657,255, filed on Apr. 13, 2018.

(51) Int. Cl.
| | |
|---|---|
| *C23C 16/54* | (2006.01) |
| *C23C 16/455* | (2006.01) |
| *C23C 16/458* | (2006.01) |

(52) U.S. Cl.
CPC ........ *C23C 16/54* (2013.01); *C23C 16/45504* (2013.01); *C23C 16/45514* (2013.01);
(Continued)

(58) Field of Classification Search
None
See application file for complete search history.

(56) References Cited

U.S. PATENT DOCUMENTS

| | | |
|---|---|---|
| 3,156,090 A | 11/1964 | Kaufman |
| 3,913,320 A | 10/1975 | Reader et al. |

(Continued)

FOREIGN PATENT DOCUMENTS

| | | |
|---|---|---|
| CN | 1148824 A | 4/1997 |
| CN | 1235695 A | 11/1999 |

(Continued)

OTHER PUBLICATIONS

Goodfellow et al., "An Experimental and Theoretical Analysis of the Grid Clearing Capability of the NSTAR Ion Propulsion System," Jet Propulsion Laboratory, Jun. 1999, 11 pages.

(Continued)

*Primary Examiner* — Parviz Hassanzadeh
*Assistant Examiner* — Margaret Klunk
(74) *Attorney, Agent, or Firm* — Leason Ellis LLP

(57) ABSTRACT

An injector block for supplying one or more reactant gases into a chemical vapor deposition reactor. The injector block including a plurality of first reactant gas distribution channels between one or more first reactant gas inlets and a plurality of first reactant gas distribution outlets to deliver a first reactant gas into the reactor, and a plurality of second reactant gas distribution channels between one or more second reactant gas inlets and a plurality of second reactant gas distribution outlets to deliver a second reactant gas into the reactor, the plurality of second reactant gas distribution outlets partitioned into at least a second reactant gas first zone and a second reactant gas second zone, the second reactant gas second zone at least partially surrounding the second reactant gas first zone.

23 Claims, 6 Drawing Sheets

(52) U.S. Cl.
CPC .. *C23C 16/45561* (2013.01); *C23C 16/45565*
(2013.01); *C23C 16/45574* (2013.01); ***C23C
16/45578*** (2013.01); *C23C 16/4584* (2013.01)

(56) References Cited

U.S. PATENT DOCUMENTS

| | | | |
|---|---|---|---|
| 4,565,618 A | 1/1986 | Banks | |
| 4,708,493 A | 11/1987 | Stein | |
| 4,783,593 A | 11/1988 | Noble | |
| 4,873,467 A | 10/1989 | Kaufman et al. | |
| 4,929,322 A | 5/1990 | Sue et al. | |
| 5,433,386 A | 7/1995 | Wieczorek et al. | |
| 5,552,017 A | 9/1996 | Jang et al. | |
| 5,603,169 A | 2/1997 | Kim | |
| 5,673,562 A | 10/1997 | Friedt | |
| 5,759,281 A | 6/1998 | Gurary et al. | |
| 5,884,009 A | 3/1999 | Okase | |
| 6,031,239 A | 2/2000 | Shi et al. | |
| 6,042,900 A | 3/2000 | Rakhimov et al. | |
| 6,116,080 A | 9/2000 | Logue et al. | |
| 6,161,500 A * | 12/2000 | Kopacz | C23C 16/45514 |
| | | | 118/723 E |
| 6,192,739 B1 | 2/2001 | Logue et al. | |
| 6,199,423 B1 | 3/2001 | Logue et al. | |
| 6,217,662 B1 | 4/2001 | Kong et al. | |
| 6,231,933 B1 | 5/2001 | Grant | |
| 6,261,421 B1 | 7/2001 | Meunier et al. | |
| 6,262,539 B1 | 7/2001 | Shi et al. | |
| 6,279,379 B1 | 8/2001 | Logue et al. | |
| 6,302,964 B1 | 10/2001 | Umotoy et al. | |
| 6,464,891 B1 | 10/2002 | Druz et al. | |
| 6,465,780 B1 | 10/2002 | Anders et al. | |
| 6,465,793 B1 | 10/2002 | Anders | |
| 6,492,625 B1 | 12/2002 | Boguslavskiy et al. | |
| 6,506,252 B2 | 1/2003 | Boguslavskiy et al. | |
| 6,548,817 B1 | 4/2003 | Anders et al. | |
| 6,548,871 B1 | 4/2003 | Horita et al. | |
| 6,726,769 B2 | 4/2004 | Boguslavskiy et al. | |
| 6,786,035 B2 | 9/2004 | Stickelmaier | |
| 6,800,139 B1 * | 10/2004 | Shinriki | C23C 16/45565 |
| | | | 118/715 |
| 6,895,825 B1 | 5/2005 | Barkhoudarian | |
| 6,902,623 B2 | 6/2005 | Gurary et al. | |
| 7,462,243 B2 | 12/2008 | Laflamme, Jr. et al. | |
| 7,557,362 B2 | 7/2009 | Yevtukhov et al. | |
| 7,570,368 B2 | 8/2009 | Belousov et al. | |
| 7,666,323 B2 | 2/2010 | Boguslavskiy et al. | |
| 7,718,554 B2 | 5/2010 | Yoo et al. | |
| 8,021,487 B2 | 9/2011 | Boguslavskiy et al. | |
| 8,092,599 B2 | 1/2012 | Sferlazzo et al. | |
| 8,133,322 B2 | 3/2012 | Nakamura et al. | |
| 8,287,646 B2 | 10/2012 | Mitrovic et al. | |
| 8,303,713 B2 | 11/2012 | Belousov et al. | |
| 8,715,418 B2 | 5/2014 | Chen | |
| 8,888,360 B2 | 11/2014 | Gurary et al. | |
| 8,895,107 B2 | 11/2014 | Gurary et al. | |
| 9,038,364 B2 | 5/2015 | Stickelmaier et al. | |
| 9,269,545 B2 | 2/2016 | Vetter | |
| 9,411,237 B2 | 8/2016 | Xie et al. | |
| 9,534,724 B2 | 1/2017 | Jiang et al. | |
| 9,748,113 B2 | 8/2017 | Armour et al. | |
| 9,945,031 B2 | 4/2018 | Jiang et al. | |
| 10,014,164 B2 | 7/2018 | Druz et al. | |
| 10,099,185 B2 | 10/2018 | Logue et al. | |
| 10,570,510 B2 | 2/2020 | Mitrovic et al. | |
| 10,571,430 B2 | 2/2020 | Cheng et al. | |
| 2002/0076902 A1 | 6/2002 | Geusic | |
| 2002/0124662 A1 | 9/2002 | Suzuki et al. | |
| 2003/0094903 A1 * | 5/2003 | Tao | C23C 16/45565 |
| | | | 315/111.91 |
| 2003/0173870 A1 | 9/2003 | Simon Hsu | |
| 2003/0236642 A1 | 12/2003 | Timans | |
| 2004/0060518 A1 | 4/2004 | Nakamura et al. | |
| 2004/0075060 A1 | 4/2004 | Luten et al. | |
| 2004/0175939 A1 | 9/2004 | Nakamura et al. | |

| | | | |
|---|---|---|---|
| 2004/0219737 A1 * | 11/2004 | Quon | H01J 37/321 |
| | | | 438/222 |
| 2006/0090850 A1 | 5/2006 | Laflamme et al. | |
| 2006/0191637 A1 * | 8/2006 | Zajac | H01J 37/3244 |
| | | | 156/345.34 |
| 2006/0196417 A1 | 9/2006 | Lin et al. | |
| 2006/0214156 A1 | 9/2006 | Pan et al. | |
| 2007/0186853 A1 | 8/2007 | Gurary et al. | |
| 2007/0221127 A1 | 9/2007 | Tran et al. | |
| 2007/0284695 A1 | 12/2007 | Zani et al. | |
| 2008/0060364 A1 | 3/2008 | Watanabe et al. | |
| 2008/0078746 A1 * | 4/2008 | Masuda | H01J 37/32449 |
| | | | 257/E21.252 |
| 2008/0280135 A1 | 11/2008 | Lee et al. | |
| 2008/0314311 A1 * | 12/2008 | Burrows | C23C 16/4557 |
| | | | 427/253 |
| 2009/0238971 A1 | 9/2009 | Higashi et al. | |
| 2010/0092668 A1 | 4/2010 | Hegedus | |
| 2010/0101947 A1 | 4/2010 | Nishimura et al. | |
| 2010/0143588 A1 | 6/2010 | Belousov et al. | |
| 2010/0273320 A1 | 10/2010 | Kappeler et al. | |
| 2010/0300359 A1 | 12/2010 | Armour et al. | |
| 2010/0317140 A1 | 12/2010 | Brailove et al. | |
| 2010/0322604 A1 | 12/2010 | Fondurulia et al. | |
| 2011/0027480 A1 | 2/2011 | Han | |
| 2012/0040097 A1 | 2/2012 | Volf et al. | |
| 2012/0048198 A1 | 3/2012 | Yamaoka et al. | |
| 2012/0160170 A1 | 6/2012 | Yamaguchi et al. | |
| 2012/0171870 A1 | 7/2012 | Mitrovic et al. | |
| 2013/0167771 A1 | 7/2013 | Yamaguchi et al. | |
| 2013/0177706 A1 | 7/2013 | Baluja et al. | |
| 2013/0221457 A1 | 8/2013 | Conti et al. | |
| 2013/0235439 A1 | 9/2013 | Yamaichi | |
| 2013/0252404 A1 | 9/2013 | Krishnan et al. | |
| 2013/0340677 A1 | 12/2013 | Tas et al. | |
| 2013/0341433 A1 * | 12/2013 | Roy | C23C 16/45565 |
| | | | 239/548 |
| 2013/0343425 A1 | 12/2013 | Tas et al. | |
| 2014/0014039 A1 | 1/2014 | Naito et al. | |
| 2014/0060153 A1 | 3/2014 | Logue et al. | |
| 2014/0109549 A1 | 4/2014 | Stickelmaier et al. | |
| 2014/0114282 A1 | 4/2014 | Gray | |
| 2014/0116330 A1 | 5/2014 | Belousov et al. | |
| 2014/0217022 A1 | 8/2014 | Hashaikeh et al. | |
| 2014/0231550 A1 * | 8/2014 | Krucken | C23C 16/45565 |
| | | | 239/548 |
| 2014/0284404 A1 * | 9/2014 | Kuah | C23C 16/45565 |
| | | | 239/408 |
| 2014/0287142 A1 | 9/2014 | Boyd et al. | |
| 2015/0007771 A1 | 1/2015 | Silva et al. | |
| 2015/0017785 A1 | 1/2015 | Gu et al. | |
| 2015/0064361 A1 | 3/2015 | Greer et al. | |
| 2015/0075431 A1 | 3/2015 | Barriss et al. | |
| 2015/0162189 A1 | 6/2015 | Xie et al. | |
| 2015/0368799 A1 * | 12/2015 | Jiang | C23C 16/45574 |
| | | | 427/255.28 |
| 2016/0010210 A1 * | 1/2016 | Yanai | C23C 16/45574 |
| | | | 118/704 |
| 2016/0027608 A1 | 1/2016 | Madocks | |
| 2016/0041126 A1 | 2/2016 | Logue et al. | |
| 2016/0338199 A1 | 11/2016 | Hua et al. | |
| 2017/0032974 A1 | 2/2017 | Armour et al. | |
| 2017/0167024 A1 * | 6/2017 | Wiltse | C23C 16/45574 |
| 2017/0253967 A1 | 9/2017 | Mitrovic et al. | |
| 2017/0261471 A1 | 9/2017 | Cheng et al. | |
| 2017/0330738 A1 | 11/2017 | Druz et al. | |
| 2017/0369984 A1 | 12/2017 | Druz et al. | |
| 2019/0316258 A1 | 10/2019 | Mitrovic et al. | |
| 2020/0354828 A1 | 11/2020 | Gurary et al. | |

FOREIGN PATENT DOCUMENTS

| | | | |
|---|---|---|---|
| CN | 105441904 | | 3/2016 |
| CN | 105704903 | A | 6/2016 |
| CN | 106906453 | | 6/2017 |
| CN | 210030883 | | 2/2020 |
| DE | 1901037 | A | 2/1971 |
| DE | 102004053659 | B3 | 4/2006 |

(56) References Cited

FOREIGN PATENT DOCUMENTS

| | | | |
|---|---|---|---|
| EP | 0730151 | A | 9/1996 |
| JP | S63238533 | A | 10/1988 |
| JP | 20010077109 | | 3/2001 |
| JP | 20020110567 | | 4/2002 |
| JP | 2004-537060 | A | 12/2004 |
| JP | 2006-108312 | A | 4/2006 |
| JP | 2011-132078 | A | 7/2011 |
| JP | 20120511259 | | 5/2012 |
| KR | 10-0513920 | B1 | 9/2005 |
| TW | 201237994 | A | 9/2012 |

OTHER PUBLICATIONS

Loeb et al., "Feasibility Study of Large-Scale Rf-Ion Thrusters," University Giessen , 1988, 13 pages.

Chapman, "Glow Discharge Processes," J. Wiley & Sons, 1980, p. 10.

Lieberman et al., "Principals of Plasma Discharges and Materials Processing," John Wiley & Sons, 1993, p. 450 & pp. 458-460.

Scheibe et al., "Deposition of Superhard Morphous Carbon Films by Pulsed Arc Sources," XVIIth International Symposium on Discharges and Electrical Insulations in Vacuum, Berkley, 1996, p. 941-945.

Boxman et al., "Vacuum Arc Deposition Devices," Rev. Sci. Instrum., 77, 021101 (2006), 16 pages.

Chen, "Introduction to Plasma Physics," Plenum, New York, 1974, Chapt. 2.3.3, 9 pages.

Krinberg et al., "Pinch Effect in Vacuum Arc Plasma Sources Under Moderate Discharge Currents," J. Phys. D.: Appl. Phys. 35(2002) 549-562.

316L Stainless Steel Product Data Bulletin, AK Steel (Year: 2016).

Fisher et al."On an Absolute Criterion for Fitting Frequency Curves," Messenger Mathematics, 41, pp. 155-160, 1912.

Trees et al."Detection and Estimation Theory," John Wiley & Sons, Inc., New York, 1968.

Armour, Eric. "UV-Illumination: Point Defect Management in GaN Growth". Growth Meeting, Jan. 9, 2015, 5 pages.

Bryan, Zachary, et al. "Fermi level control of compensating point defects during metalorganic chemical vapor deposition growth of Si—doped AlGaN". Applied Physics Letters, 105, 222101 (2014), 5 pages.

Bryan, Zachary, et al. "Fermi Level Control of Point Defects During Growth of Mg—Doped GaN". Journal of Electronic Materials, vol. 42, No. 5, Dec. 5, 2012, 5 pages.

Hoffman, Marc, et al. "Point defect management in GaN by Fermi-level control during growth". SPIE, 8986 (2014), 7 pgs.

Karlicek, Robert, et al. "High Power UV LED Industrial Curing Systems". Technical Report, US Department of Energy, May 15, 2012, 42 pages.

Eden, J.G. "VUV and UV Sources and Spectroscopic Applications". Technical Report, Dec. 1991, 143 pages.

Zhang, Yun. "Fabrication and Characterization of Gan Visible-Blind Ultraviolet Avalanche Photodiodes". Thesis, Georgia Institute of Technology, Aug. 2009, 73 pages.

Machine Translation Jp 2011-132078A (Year: 2011).

Application and File history for U.S. Appl. No. 15/448,019, filed Mar. 2, 2017. Inventors: Mitrovic et al.

Application and File history for U.S. Appl. No. 16/870,110, filed May 8, 2020. Inventors: Gurary et al.

Application and File history for U.S. Appl. No. 15/592,426, filed May 11, 2017. Inventors: Druz et al.

Application and File history for U.S. Appl. No. 15/455,678, filed Mar. 10, 2017. Inventors: Cheng et al.

Application and File history for U.S. Appl. No. 14/822,410, filed Aug. 10, 2015. Inventors: Logue et al.

Application and File history for U.S. Appl. No. 14/814,153, filed Jul. 30, 2015. Inventors: Armour et al.

Application and File history for U.S. Appl. No. 15/631,627, filed Jun. 23, 2017. Inventors: Druz et al.

Application and File history for U.S. Appl. No. 16/997,782, filed Aug. 19, 2020. Inventors: Druz et al.

PCT Application No. PCT/US2019/027312 Search Report and Written Opinion dated Jul. 30, 2019, 10 pages.

German OA in German Application No. 11 2013 003 131.0, mailed May 18, 2021 (13 pages) an English translation attached hereto.

\* cited by examiner

CHEMICAL VAPOR DEPOSITION APPARATUS WITH MULTI-ZONE INJECTION BLOCK

RELATED APPLICATION

This application claims the benefit of U.S. Provisional Application No. 62/657,255 filed Apr. 13, 2018, which is hereby fully incorporated herein by reference.

TECHNICAL FIELD

The present disclosure relates generally to semiconductor fabrication technology. More particularly, the present disclosure relates to an injector block for a chemical vapor deposition (CVD) reactor configured to improve efficiency in a vapor deposition process by reducing the amount of unused reactant gases vented from the CVD reactor, and improving vapor deposition uniformity across a growth surface.

BACKGROUND

Certain processes for fabrication of semiconductors can require a complex process for growing epitaxial layers to create multilayer semiconductor structures for use in fabrication of high performance devices, such as light emitting diodes (LEDs), laser diodes, optical detectors, power electronics, and field effect transistors. In this process, the epitaxial layers are grown through a general process called Chemical Vapor Deposition (CVD). One type of CVD process is called Metal Organic Chemical Vapor Deposition (MOCVD). In MOCVD, reactant gases are introduced into a sealed reactor chamber within a controlled environment that enables the reactor gas to be deposited on a substrate (commonly referred to as a wafer) to grow thin epitaxial layers. Examples of current product lines for such manufacturing equipment include the TurboDisc®, MaxBright®, and EPIK® families of MOCVD systems, and the PRO-PEL® Power GaN MOCVD system, all manufactured by Veeco Instruments Inc. of Plainview, N.Y.

During epitaxial layer growth, a number of process parameters are controlled, such as temperature, pressure, and gas flow rate, to achieve desired quality in the epitaxial layers. Different layers are grown using different materials and process parameters. For example, devices formed from compound semiconductors such as III-V semiconductors, typically are formed by growing a series of distinct layers. In this process, the wafers are exposed to a combination of reactant gases, typically including a metal organic compound formed using an alkyl source including a group III metal such as gallium, indium, aluminum, and combinations thereof, and a hydride source including a Group V element such as $NH_3$, $AsH_3$, $PH_3$, or an Sb metalorganic, such as tetramethyl antimony. Generally the alkyl and hydride sources are combined with a carrier gas, such as $N_2$ and/or $H_2$, which does not participate appreciably in the reaction. In these processes, the alkyl and hydride sources flow over the surface of the wafer and react with one another to form a III-V compound of the general formula $In_XGa_YAl_Z$-$N_AAs_BP_CSb_D$, where X+Y+Z equals approximately one, A+B+C+D equals approximately one, and each of X, Y, Z, A, B, C, and D can be between zero and one. In other processes, commonly referred to as "halide" or "chloride" processes, the Group III metal source is a volatile halide of the metal or metals most commonly a chloride such as $GaCl_2$. In yet other processes, bismuth is used in place of some or all of the other Group III metals.

A suitable substrate for the reaction can be in the form of a wafer having metallic, semiconducting, and/or insulating properties. In some processes the wafer can be formed of sapphire, aluminum oxide, silicon (Si), silicon carbide (SiC), gallium arsenide (GaAs), indium phosphide (InP), indium arsenide (InAs), gallium phosphide (GaP), aluminum nitride (AlN), silicon dioxide (SiO2), and the like.

In a CVD process chamber, one or more wafers are positioned within a tray, commonly referred to as a wafer carrier, so that the top surface of each wafer is exposed, thereby providing a uniform exposure of the top surface of the wafer to the atmosphere within the reactor chamber for the deposition of semiconductor materials. The wafer carrier is commonly rotated at a rotation speed on the order from about 50 to 1500 RPM or higher. While the wafer carrier is rotated, the reactant gases are introduced into the chamber from a gas distribution device, positioned upstream of the wafer carrier. The flowing gases pass downstream toward the wafer carrier and wafers, desirably in a laminar flow. One such example of a CVD process chamber is disclosed in U.S. Pat. Publ. No. 2017/0253967, the contents of which are hereby incorporated by reference herein.

During the CVD process, the wafer carrier is maintained at a desired elevated temperature by heating elements, often positioned beneath the wafer carrier. Therefore, heat is transferred from the heating elements to the bottom surface of the wafer carrier and flows upwardly through the wafer carrier to the one or more wafers. Depending on the process, the temperature of the wafer carrier is maintained on the order of between 700-1200° C. The reactive gases, however, are introduced into the chamber by the gas distribution device at a much lower temperature, typically 200° C., or lower, so as to inhibit premature reaction of the gases.

As the reactant gases approach the rotating wafer carrier, the temperature of the reactant gases substantially increase and viscous drag of the rotating wafer carrier impels the gases into rotation about an axis of the wafer carrier, so that the gases flow around the axis and outwardly toward a perimeter of the wafer carrier in a boundary region near the surface of the wafer carrier. Depending on the reactant gases used in the process, pyrolyzation can occur in or near the boundary region at an intermediate temperature between that of the gas distribution device and the wafer carrier. This pyrolyzation facilitates the interaction of the reactant gases and growth of the crystalline structure. Non-deposited gas continues to flow toward the perimeter and over the outer edge of the carrier, where it can be removed from the process chamber through one or more exhaust ports disposed below the wafer carrier.

Most commonly, this process is performed with a succession of different gas compositions and, in some cases, different wafer temperatures, to deposit a plurality of layers of semiconductor having different compositions as required to form a desired semiconductor device. For example, in formation of LEDs and diode lasers, a multiple quantum well (MQW) structure can be formed by depositing layers of III-V with different proportions of Ga and In. Each layer may be on the order of tens of Angstroms thick, i.e. a few atomic layers.

Process chambers of this type can provide a stable and orderly flow of reactant gases over the surfaces of the wafers, so that all regions of each of the wafers on the wafer carrier are exposed to substantially uniform conditions. This, in turn, promotes uniform deposition of materials on the wafers. Such uniformity is important because even minor differences in the composition and thickness of the layers of the material deposited on a wafer can influence the properties of the resulting devices.

Considerable effort has been devoted in the art towards the development of improved gas distribution devices to improve uniformity. Commonly, a gas distribution device, also referred to as an injector block or cold plate, includes a plurality of gas distribution outlets for disbursement of the reactant gases over an active gas emitting area approximately equal in size to the wafer carrier. Some of the gas distribution outlets can be configured to distribute a first reactant gas, such as a mixture of a Group III alkyl, while other gas distribution outlets are configured to distribute a second reactant gas, such as a mixture of Group V hydride. Additionally, as the reactant gases are typically maintained well below the pyrolyzation temperature, the gas distribution devices are normally provided with coolant channels. The coolant channels carry a circulating flow of water or other liquid, and thus maintain the temperature of the gas distribution outlets, so as to inhibit premature reaction of the gases.

Additionally, gas distribution devices are generally constructed to inhibit recirculation of the reactant gases upon exiting the gas distribution outlets. In some cases, recirculation of the discharged gases in the vicinity of the gas distribution outlets is reduced through the use of blade-like diffusers projecting downstream from the surface of the gas distribution outlets. One such example of a gas distribution device is disclosed in U.S. Pat. No. 8,303,713, the contents of which are hereby incorporated by reference herein.

Despite these developments, reactant gas distribution within a CVD reactor can be somewhat unpredictable. Further improvement is desirable, particularly in improved predictability in reactant gas distribution across the growth surfaces of the wafers during the CVD process and improved efficiency in the deposition process by reducing the amount of unused reactant gases vented from the process chamber, which represents non-value added costs during production.

SUMMARY OF THE DISCLOSURE

Embodiments of the present disclosure provide an improved gas distribution device or injector block having first and second reactant gases outlets, wherein the reactant gases outlets are partitioned into at least a first zone and a second zone, thereby improving predictability in reactant gas distribution across the growth surfaces of the wafers during the CVD process, and improving efficiency by reducing the amount of unused reactant gases vented from the CVD chamber.

One embodiment of the present disclosure provides an injector block for supplying one or more reactant gases into a CVD reactor. The injector block can include a plurality of first reactant gas distribution channels between one or more first reactant gas inlets and a plurality of first reactant gas distribution outlets to deliver a first reactant gas into the reactor. The injector block can further include a plurality of second gas distribution channels between one or more second reactant gas inlets and a plurality of second gas distribution outlets to deliver a second reactant gas into the reactor, wherein the plurality of second reactant gas distribution outlets are partitioned at least into a second reactant gas first zone and a second reactant gas second zone, the second reactant gas second zone at least partially surrounding the second reactant gases first zone.

In one embodiment, the second reactant gas inlet for the second reactant gas second zone is configured to supply the second reactant gas at a concentration different from that of the second reactant gas supplied to the second reactant gas first zone. In one embodiment, the second reactant gas inlet for the second reactant gas second zone is configured to supply the second reactant gas any concentration substantially equal to that of the second reactant gas supplied to the second reactant gas first zone. In one embodiment the second reactant gas second zone encircles the second reactant gas first zone. In one embodiment the second reactant gas distribution outlets of the second reactant gas first zone are alternately interspersed with the first reactant gas distribution outlets. In one embodiment the first reactant gas distribution outlets equally are spaced apart such that the axis of symmetry of the first reactant gas distribution outlets are asymmetrical about a medial plane extending in a horizontal direction. In one embodiment, the plurality of first reactant gas distribution outlets are partitioned into a first reactant gas first zone and a first reactant gas second zone. In one embodiment the first reactant gas first zone has a larger number of first reactant gas distribution outlets than the first reactant gas second zone. In one embodiment the flow rates of the first reactant gas first zone and the first reactant gas second zone or substantially equal. In one embodiment the flow rates of the first reactant gas first zone and the first reactant gas second zone are different. In one embodiment the first reactant gas first zone and the first reactant gas second zone include separate first reactant gas inlets. In one embodiment the first reactant gas inlet for the first reactant gases can zone is configured to supply the first reactant gas at a concentration different from that of the first reactant gas supplied to the first reactant gas first zone. In one embodiment, the first reactant gas inlet for the first reactant gas second zone is configured to supply the first reactant gas at a concentration substantially equal to that of the first reactant gas supplied to the first reactant gas first zone.

Another embodiment of the present disclosure provides a method of improving a chemical vapor deposition system. The method includes distributing a source of first reactant gas from a plurality of first reactant gas distribution outlets; distributing a source of second reactant gas from a plurality of second reactant gas distribution outlets, wherein the plurality of second reactant gas distribution outlets are partitioned into at least a second reactant gas first zone and a second reactant gas second zone, the second reactant gas second zone at least partially surrounding the second reactant gas first zone.

In one embodiment, the method further includes supplying the second reactant gas for the second reactant gas second zone at a concentration different from that of the second reactant gas being supplied to the second reactant gases first zone. In one embodiment, the method further includes supplying the second reactant gas for the second reactant gas second zone at a concentration substantially equal to that of the second reactant gas being supplied to the second reactant gas first zone. In one embodiment, the second reactant gas second zone encircles the second reactant gas first zone. In one embodiment, the plurality of the first reactant gas distribution outlets are partitioned into a first reactant gas first zone and a first reactant gas second zone. In one embodiment, the first reactant gas first zone has a larger number of first reactant gas distribution outlets than the first reactant gas second zone. In one embodiment, the method further includes supplying the first reactant gas at substantially equal flow rates to the first reactant gas first zone and the first reactant gas second zone. In one embodiment, the first reactant gas first zone and the first reactant gas second zone include separate reactant gas inlets. In one embodiment, the method further includes supplying the first reactant gas in the first reactant gas first zone and the first reactant gas in the first reactant gas second zone at different flowrates.

Another embodiment of the present disclosure provides a CVD reactor. The reactor can include a susceptor, wafer carrier, spindle, and injector block. The wafer carrier can extend radially outward from an axis. The wafer carrier has a top surface and a bottom surface. The top surface can be adapted to hold or support one or more wafers (or substrates) and the bottom surface can be adapted to engage the top or upper end of the spindle. The wafer carrier can be removably mounted on the spindle. The injector block can be configured to supply one or more reactant gases to a top surface of the wafer carrier. The injector block can include a plurality of first reactant gas distribution channels between one or more first reactant gas inlets and a plurality of first reactant gas distribution outlets to deliver a first reactant gas into the reactor. The injector block can further include a plurality of second reactant gas distribution channels between one or more second reactant gas inlets and a plurality of second reactant gas distribution outlets to deliver a second reactant gas into the reactor, wherein the plurality of second reactant gas distribution outlets are partitioned into at least a second reactant gas first zone and a second reactant gas second zone, the second reactant gas second zone at least partially surrounding the second reactant gas first zone.

In one embodiment, the second reactant gas inlet for the second reactant gas second zone is configured to supply the second reactant gas at a concentration different from that of the second reactant gas supplied to the second reactant gas first zone. In one embodiment, the second reactant gas inlet for the second reactant gas second zone is configured to supply the second reactant gas at a concentration substantially equal to that of the second reactant gas supplied to the second reactant gas first zone. In one embodiment, the second reactant gas second zone encircles the second reactant gas first zone. In one embodiment, the second reactant gas distribution outlets of the second reactant gas first zone are alternately interspersed with the first reactant gas distribution outlets. In one embodiment, the first reactant gas distribution outlets are equally spaced apart, such that the axis of symmetry of the first reactant gas distribution outlets is asymmetrical about a medial plane extending in a horizontal direction. In one embodiment, the plurality of first reactant gas distribution outlets are partitioned into a first reactant gas first zone and a first reactant gas second zone. In one embodiment, the first reactant gas first zone has a larger number of first reactant gas distribution outlets than the first reactant gas second zone. In one embodiment, the flow rates of the first reactant gas first zone and the first reactant gas second zone are substantially equal. In one embodiment, the flow rates of the first reactant gas first zone and the first reactant gas second zone are different. In one embodiment, the first reactant gas first zone and the first reactant gas second zone include separate first reactant gas inlets. In one embodiment, the first reactant gas inlet for the first reactant gas second zone is configured to supply the first reactant gas at a concentration different from the first reactant gas supplied to the first reactant gas first zone. In one embodiment, the first reactant gas inlet for the first reactant gas second zone is configured to supply the first reactant gas a concentration substantially equal to that of the first reactant gas supplied to the first reactant gas first zone. In some embodiments, the first reactant gas distribution channels can extend in a linear pattern, a radial pattern, or a combination thereof. For example, in one embodiment, the first reactant gas distribution channels can be configured as an annular channel in proximity to a perimeter of the injector block, and a plurality of channels traversing linearly through a portion of the injector block. In some embodiments, the second reactant gas distribution channels can extend in a linear pattern, a radial pattern, or a combination thereof. For example, in one embodiment, the second reactant gas distribution channels can be configured as an annular channel in proximity to a perimeter of the injector block, and a circular chamber defined within the injector block.

The summary above is not intended to describe each illustrated embodiment or every implementation of the present disclosure. The figures and the detailed description that follow more particularly exemplify these embodiments.

BRIEF DESCRIPTION OF THE DRAWINGS

The disclosure can be more completely understood in consideration of the following detailed description of various embodiments of the disclosure, in connection with the accompanying drawings, in which.

Figure 1:
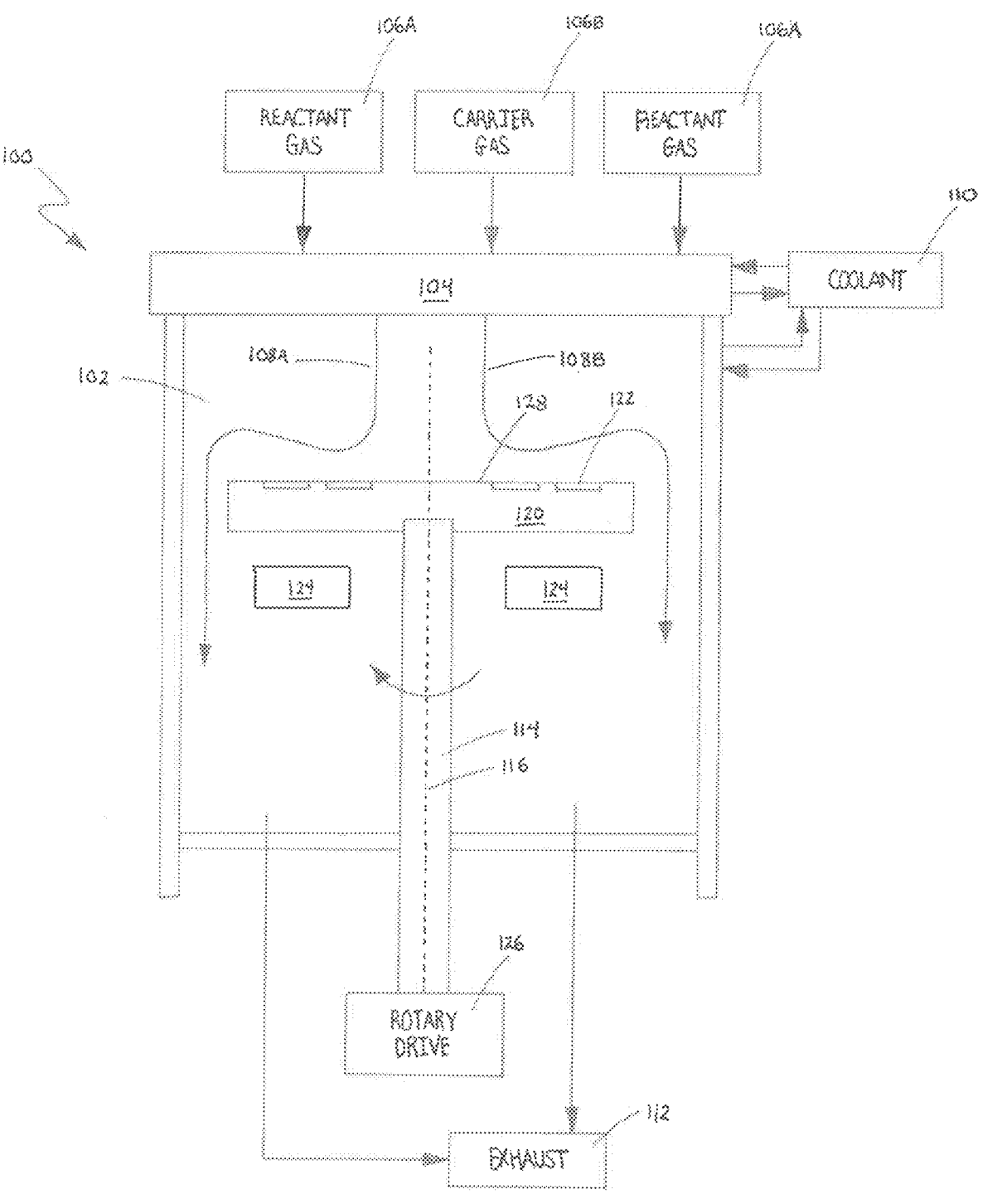
FIG. 1 is a schematic view depicting a CVD reactor in accordance with an embodiment of the disclosure.

While embodiments of the disclosure are amenable to various modifications and alternative forms, specifics thereof shown by way of example in the drawings will be described in detail. It should be understood, however, that the intention is not to limit the disclosure to the particular embodiments described. On the contrary, the intention is to cover all modifications, equivalents, and alternatives falling within the spirit and scope of the subject matter as defined by the claims.

DETAILED DESCRIPTION

Referring to FIG. 1, a schematic view of a CVD reactor 100 is depicted in accordance with an embodiment of the disclosure. The reactor 100 defines a process chamber 102 configured to serve as a process environment space. A gas distribution device or injector block 104 is arranged at one end of the process chamber 102. The end of the process chamber 102 in which the injector block 104 is arranged can be referred to as the "top" end of the process chamber 102. This end of the chamber typically, but not necessarily, is disposed at the top of the chamber in the normal gravitational frame of reference. Thus, the downward direction as used herein refers to as the direction away from the injector block 104; whereas the upward direction refers to the direction within the chamber, toward the injector block 104, regardless of whether the instructions are aligned with the gravitational upward and downward directions. Similarly, the "top" and "bottom" surfaces of elements may be described herein with reference to the frame of reference of the process chamber 102 and the injector block 104.

The injector block 104 can be operably coupled to one or more gas supplies 106A/B for supplying gases to be used in the CVD process, such as reactant and carrier gases. The injector block 104 is arranged to receive the various gases from the gas supplies 106A/B, and direct the flow of the gases 108A/B into the reactor chamber 102 in a generally downward direction. In one embodiment, the injector block 104 includes a coolant system 110 configured to circulate a cooling fluid to maintain the injector block 104 at a desired temperature during operation. The coolant system 110 can also be configured to circulate a cooling fluid through the walls of the process chamber 102. The process chamber 102 is also equipped with an exhaust system 112 configured to remove spent gases from the interior of the chamber 102, so as to enable a continuous flow of gas in the downward direction from the injector block 104.

A spindle 114 can be arranged within the process chamber 102, so that a central axis 116 of the spindle 114 extends in the upward/downward direction. The spindle 114 can be mounted within the process chamber 102 by a conventional rotary pass-through device incorporating bearings and seals so that the spindle 114 can rotate while maintaining a seal with the walls of the process chamber 102.

Wafer carrier 120 can be releasably mounted to the top end of the spindle 114. The wafer carrier 120 can have one or more pockets 122 into which wafers are held and onto which semiconductor materials can be epitaxially grown. The wafer carrier 120 can have a generally circular cross-section, arranged about the central axis 116. A heating element 124 can be mounted within the process chamber 102 and at least partially surround the spindle 114. Accordingly, in one embodiment, the process chamber 102, injector block 104, spindle 114, wafer carrier 120, and heating element 124 are arranged symmetrically about the central axis 116. The spindle 114 can be connected to a rotary drive mechanism 126, such as an electric motor drive, configured to rotate the spindle 114 and wafer carrier 120 at a desired speed. In one embodiment, the rotary drive mechanism is configured to rotate the spindle 114 at a rotational speed of between 50-1500 RPM.

Process gas can be introduced into the process chamber 102 through the injector block 104. Following introduction, the process gas passes downwardly toward the wafer carrier 120, and over the top surface 128 of the wafer carrier 120 where the wafers are held. The flow of process gas 108A/B continues to flow around the periphery of the wafer carrier 120, and is eventually exhausted from the process chamber 102 through the exhaust system 112. Often the process gas in proximity to the top surface 128 is predominantly composed of a carrier gas, such as $H_2$ and/or $N_2$, with some amount of first and second reactive gas components. In one embodiment, the first reactive gas component can be an alkyl source Group III metal, and the second reactive gas component can be a hydride source Group V element.

The heating element 124 can transfer heat to the wafer carrier 120, principally by radiant heat transfer. In other embodiments, the wafer carrier 120 can be heated via inductive heat transfer. The applied heat from the heating elements 124 is transferred upwardly through the body of the wafer carrier 120 to the top surface 128 thereof. Some portion of the heat on the top surface 128 of the wafer carrier 120 is transferred to the wafers and the process gas 108A/B passing over the top surface one twenty. Inadvertently, some portion of the heat is also transferred to cooler elements within the process chamber 102, such as the walls of the process chamber 102 and the injector block 104.

Pyrolyzed gas is desirably removed from the process chamber 102 prior to accumulating on any of these cooler structures, particularly as condensation can occur more rapidly on relatively cooler surfaces. To aid in the removal of pyrolyzed gas, in one embodiment, the wall structure of the process chamber 102 can form an upper and lower shutter configured to encourage downward gas flow, thereby reducing or eliminating any vortex that would otherwise recirculate hot pirate ties pyrolyzed gases back upwards toward relatively cooler surfaces, such as the injector block 104, to condense.

Improvements in the injector block 104 can further promote a more uniform growth rate across the top surface 128 of the wafer carrier 120. Additionally, improvements in the injector block 104 can promote a more efficient use of the reactant gases within the process chamber 102, such that a smaller quantity of unused reactive gases are vented from the process chamber 102, thereby representing a significant operational cost savings over CVD reactors of the prior art.

Figure 2A:
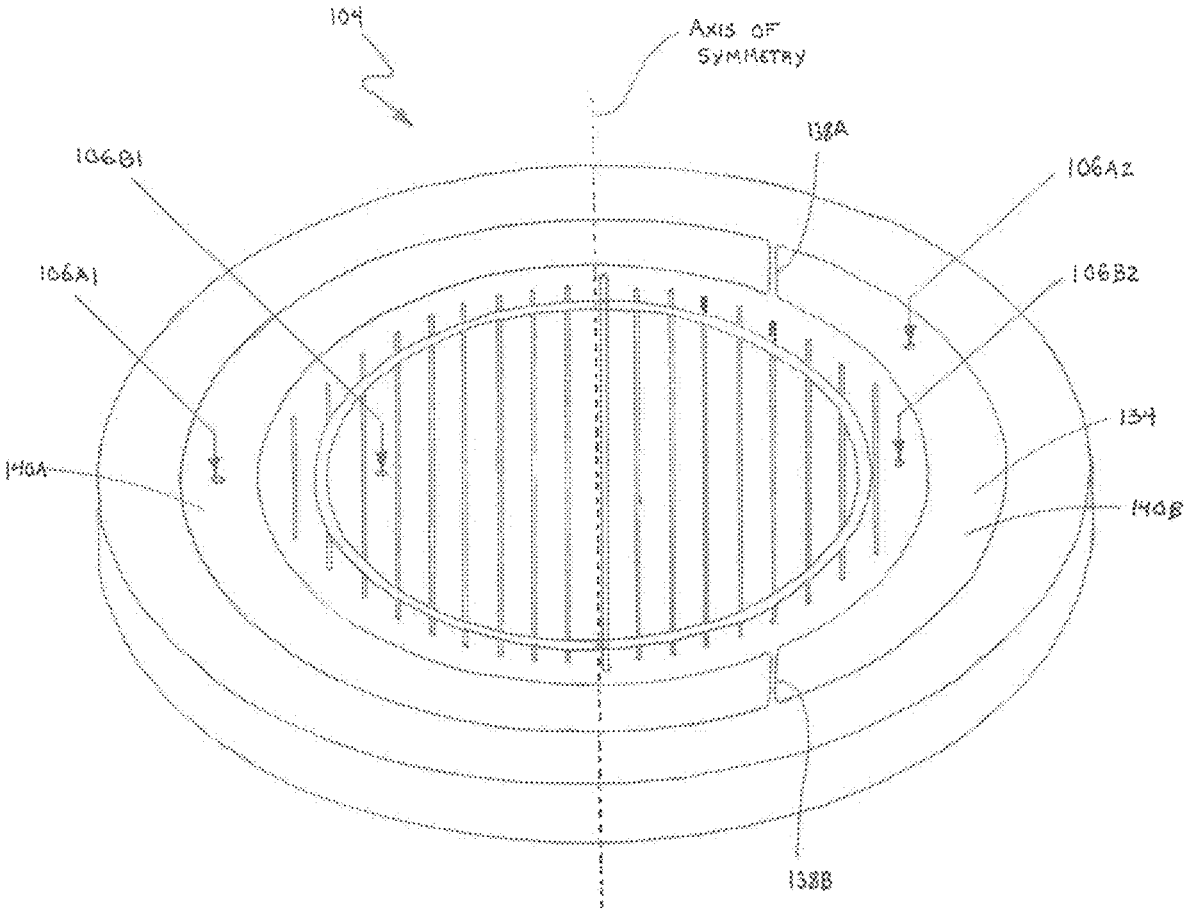
FIG. 2A is a perspective view of an injector block in accordance with an embodiment of the disclosure.
Figure 2B:
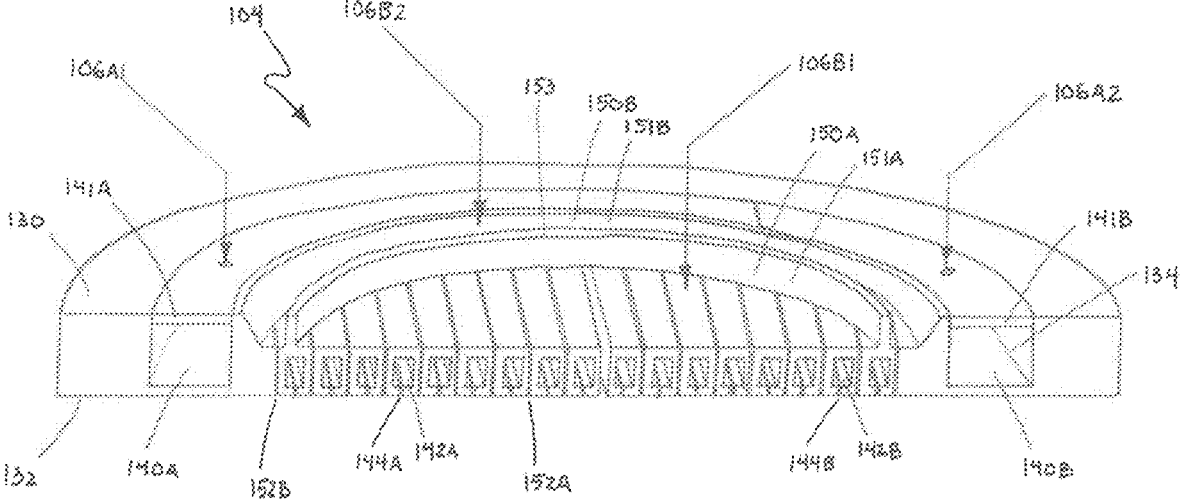
FIG. 2B is a cross-sectional view depicting the injector block of FIG. 2A.

Referring to FIG. 2A, a perspective view of an injector block 104 is depicted in accordance with an embodiment of the disclosure. FIG. 2B depicts a cross-sectional view of the injector block 104 of FIG. 2A. In some embodiments, the injector block 104 can alternatively be referred to as a gas distribution device and/or a cold plate. The injector block 104 is positioned in the top end of the process chamber 102. The injector block 104 can have an upstream surface 130 and a downstream surface 132 (as depicted in FIG. 2B). The downstream surface 132 of the injector block 104 can face the downstream direction, toward the wafer carrier 120 and wafers. The injector block 104 can be operably coupled to one or more sources of gas 106A/B, thereby enabling distribution of the reactant and carrier gases. The injector block 104 can further operably coupled to a coolant supply 110 (as depicted in FIG. 1), thereby enabling coolant to flow through a portion of the injector block 104 to aid in maintaining the reactant and carrier gases at a desirable temperature.

In one embodiment, the one or more first sources of gas 106A1-2, alternatively referred to as first reactant gas inlets, can be configured to supply first reactant gas, such as a Group III alkyl metal, typically in admixture with a carrier gas such as $H_2$ and/or $N_2$, to the injector block 104. The first reactant gas inlets 106A1-2 can be in fluid communication with a first reactant flow path 134. In one embodiment the flow path 134 can be a conduit defined within a portion of the injector block 104. For example, in one embodiment, the flow path 134 can be configured as one or more annular channels positioned in proximity to a perimeter of the injector block 104. In one embodiment, the flow path 134 is defined as an annular groove having one or more dividers 138A/B, alternatively referred to as baffles, thereby dividing the alkyl or first reactant flow path 134 into a first reactant gas first zone 140A and a first reactant gas second zone 140B. With additional reference to FIG. 2B, in some embodiments, the first reactant gas first and second zones 140A/B can be at least partially sealed by one or more plates 141A/B.

As depicted in FIG. 2B, the respective first reactant gas first and second zones 140A/B can include a plurality of distribution channels 142A/B traversing through a portion of the injector block 104. In some embodiments, the distribution channels 142A/B can traverse linearly through a portion of the injector block 104. In one embodiment, the lower portion of a wall defining the distribution channels 142A/B can define a distribution outlet 144A/B extending lengthwise along the distribution channels 142A/B, thereby enabling the first reactant gas within the distribution channels 142A/B to be introduced into the process chamber 102. In some embodiments, the distribution outlets 144A/B can further pass through a nozzle to present a desirable distribution flow.

In some embodiments, a first quantity of the first reactant gas flows into the first reactant gas inlet 106A1, through the first reactant gas first zone 140A, and out through corresponding distribution outlets 144A defined by the first distribution channels 142A. A second quantity of the first reactant gas flows into the second reactor gas inlet 106A2, through the second zone 140B, and out through corresponding distribution outlets 144B defined by the second distribution channels 142B. Thereafter, the first reactant gases flow downward within the process chamber 102, towards the wafer carrier 120 and wafers.

In some embodiments, the first reactant gas first zone 140A can include a greater number of distribution channels 142A and/or distribution outlets 144A than the first reactant gas second zone 140B. For example, as depicted, in one embodiment, there are fourteen first distribution channels 142A, and three second distribution channels 142B. In other embodiments, other quantities of distribution channels are contemplated. In some embodiments, the flow rate of the first reactant gas can be substantially uniform across the injector block 104 (e.g., the flow rates between the first zone 140A and the second zone 140B can be substantially equal). In other embodiments, the flow rate of the first reactant gas within the first zone 140A can be either relatively higher or lower than the flow rate within the second zone 140B. In some embodiments, the first reactant gas supply to the second inlet 106A2 can include a higher concentration of reactant gas, relative to the concentration of reactant gas supplied to the first inlet 106A1. In other embodiments, the concentration of the reactant gas supply to the first and second inlets 106A1-2 can be substantially equal.

In one embodiment, the injector block 104 can include one or more second reactant gas inlets 106B1-2, configured to supply second reactant gases, such as Group V hydrides, typically in admixture with a carrier gas such as $H_2$ and/or $N_2$, to the injector block 104. The second reactant gas inlets 106B1-2 can be in fluid communication with a second reactant flow path and/or distribution channels 150A-B. The distribution channels 150 can be configured as one or more annular channels, linear channels, or a combination thereof. In one embodiment, the second reactant distribution channels 150A-B can be divided into a first zone 151A and a second zone 151B. In some embodiments, the second zone 151B can at least partially encircle the first zone 151A. In one embodiment, the first zone 151A can be partitioned from the second zone 151B by a groove or divider 153.

The respective second reactant gases within the first and second zones 151A/B can be in fluid communication with a plurality of second reactant gas outlets 152A/B. In one embodiment, the second reactant gas outlets 152A/B can generally be positioned beneath the first and second zones 151A/B, thereby enabling the second reactant gas within the first and second zones 151A/B to be introduced into the process chamber 102. In some embodiments, the distribution outlets 152 pass through diffusers, which can in some embodiments can be defined between adjacent first reactant gas outlet nozzles. Accordingly, in one embodiment, at least a portion of the second reactant gas distribution outlets 152A-B can be interspersed with at least a portion of the first reactant gas distribution outlets 144.

In one embodiment, a first quantity of the second reactant gas flows into the second reactant gas inlets 106B1, into the respective first distribution channel 150A of the second reactant gas first zone 151A, and out through the corresponding distribution outlets 152A. A second quantity of second reactant gas flows into the second reactant gas inlet 106B2, into the second distribution channel 150B of the second reactant gas second zone 151B, and out through the corresponding second distribution outlets 152B. Thereafter, the second reactant gases flow downward within the process chamber 102, toward the wafer carrier 120 and wafers.

In some embodiments, the second reactant gas first zone can include a greater number of distribution outlets 152 than the second reactant gas second zone. In some embodiments, the flow rate of the second reactant gas can be substantially uniform across the injector block 104 (e.g., the flow rates between the first zone 151A and the second zone 151B can be substantially equal). In other embodiments, the flow rate of the second reactant gas within the first zone 151A can be either relatively higher or lower than the flow rate of the second zone 151B. In some embodiments, the supply of second reactant gas to the first inlet 106B1 can include a higher concentration of reactant gas, relative to the concentration of reactant gas supplied to the second inlet 106B2. For example, in one embodiment, the gas within the second zone 151B can primarily be composed of $H_2$ and/or $N_2$, while the first zone 151A serves as the primary hydride source. In other embodiments, the concentration of reactant gas supply to the first and second inlets 106B1-2 can be substantially equal.

Figure 3A:
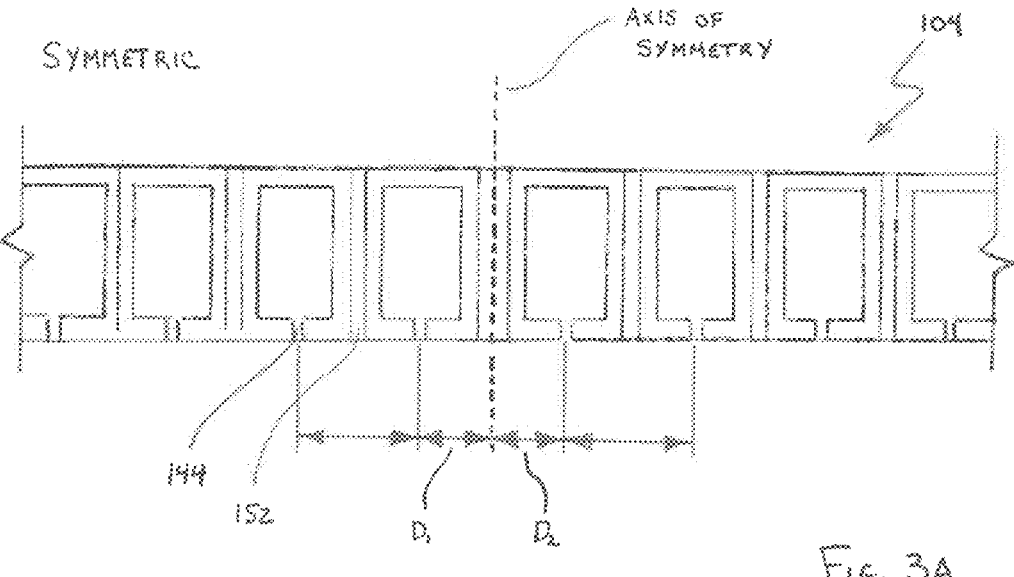
FIG. 3A depicts a symmetrical arrangement of first and second reactant gas outlets on an injector block in accordance with an embodiment of the disclosure.
Figure 3B:
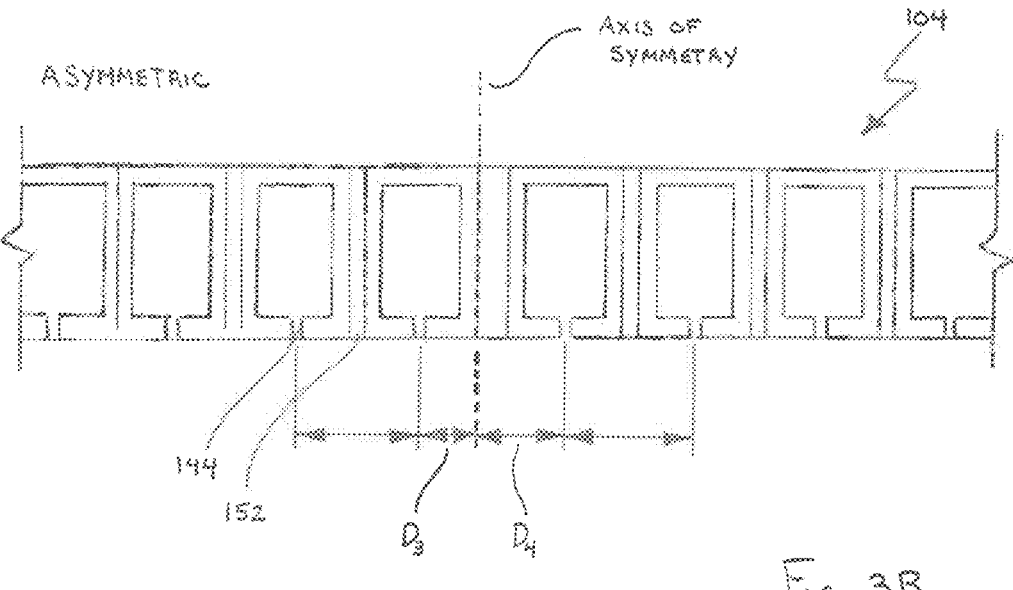
FIG. 3B depicts an asymmetrical arrangement of first and second reactant gas outlets on an injector block in accordance with an embodiment of the disclosure.

Referring to FIGS. 3A-B, the gas distribution outlets 144/152 can be either symmetrical or asymmetrical in relation to an axis of symmetry of the injector block 104. As depicted in FIG. 3A, the distribution outlets 144 on either side of the axis of symmetry are positioned an equal distance apart from the axis of symmetry (e.g., $D_1$ equals $D_2$); accordingly, FIG. 3A represents a symmetrical arrangement of the distribution outlets 144/152. By contrast, as depicted in FIG. 3B, the distribution outlets on either side of the axis of symmetry are positioned at unequal distances apart from the axis of symmetry (e.g., $D_3$ is not equal to $D_4$); accordingly, FIG. 3B represents an asymmetric arrangement of the distribution outlets 144/152. In either case, the plurality of distribution outlets 144/152 can be equally spaced apart from one another on the injector block 104; rather the difference between symmetrical and asymmetrical arrangements depends on the distribution outlets network spacing from the axis of symmetry.

Figures 4, 5:
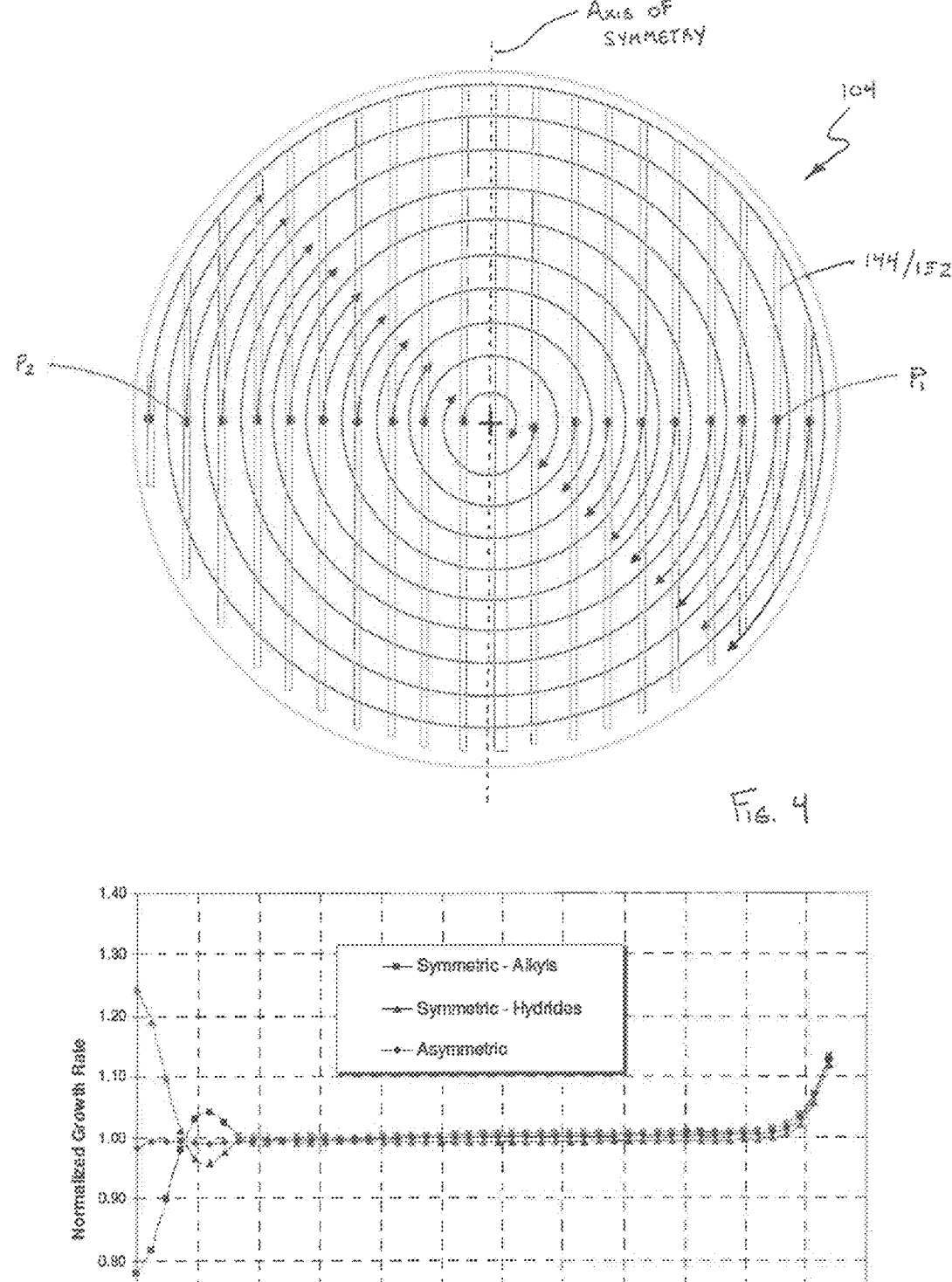
FIG. 4 depicts a trace of points along distribution outlets of an asymmetrically arranged injector block in accordance with an embodiment of the disclosure.
FIG. 5 is a graphical representation of CVD growth rates corresponding to symmetrically and asymmetrically arranged injector blocks in accordance with embodiments of the disclosure.

As depicted in FIG. 4, an asymmetric arrangement provides an improvement in flow uniformity beneath the injector block 104. Specifically, because the wafer carrier 120 rotates generally about the axis of symmetry beneath the injector block 104, a given point $P_i$ along an outlet 144/152 positioned on one side of the axis of symmetry will trace concentric circles different from the concentric circles of a given point $P_2$ along an outlet 144/152 positioned on the opposite side of the axis of symmetry. Accordingly, in some embodiments, the effective spacing between distribution outlets 144/152 can be effectively reduced (e.g., reduced by 50%), thereby improving reactant gas distribution and uniformity of CVD growth. Referring to FIG. 5, a graphical representation of the CVD growth rates corresponding to symmetric and asymmetric outlet distributions are depicted in accordance with embodiments of the disclosure. Improvements in uniformity of CVD growth rates enables the distribution outlets 144/152 of asymmetrical injector blocks to be spaced further apart, which represents reduced manufacturing costs, and in some cases improved gas flow, as the various distribution channels can be made larger in size.

Figure 6:
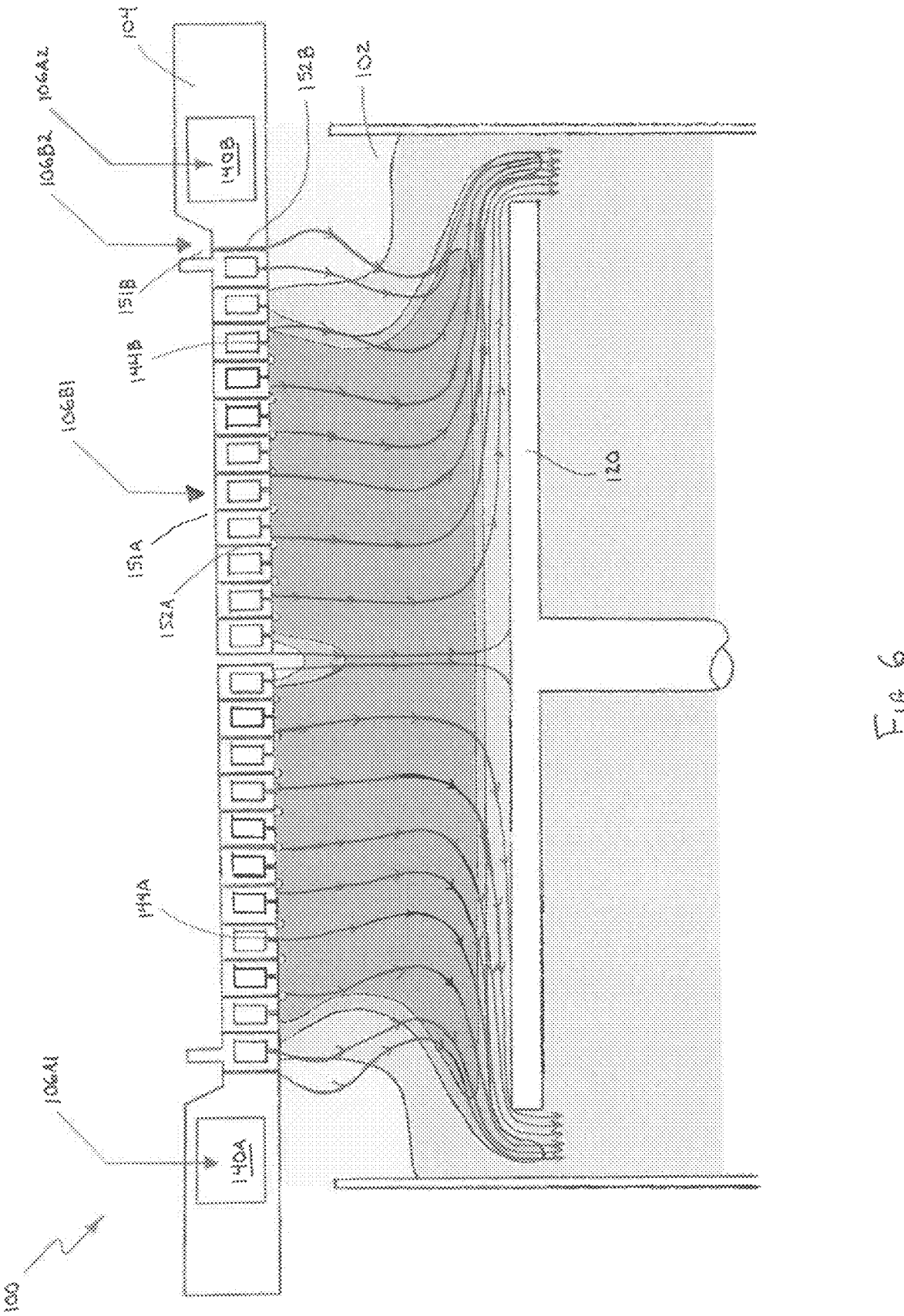
FIG. 6 depicts an operational flow of reactant gas flowing into a process chamber during a CVD process in accordance with an embodiment of the disclosure.

Referring to FIG. 6, a cross-sectional view of the CVD reactor 100, showing the reactant gas concentrations and flow lines within the process chamber 102 during a CVD process, is depicted in accordance with an embodiment of the disclosure. In operation, a first reactant gas, such as a Group III alkyl metal in admixture with one or more carrier gases such as $H_2$ and/or $N_2$, is supplied through the first reactant gas inlets 106A1-2, into a respective first and second zone 140A/B, and injected into the process chamber 102 via a plurality of first reactant gas outlets 144A/B. Similarly, a second reactant gas, such as a Group V hydride also in admixture with one or more carrier gases, is supplied to the second reactant gas inlets 106B1-2, into a respective first and second zone 151A/B, and injected into the process chamber 102 via a plurality of second reactant gas outlets 152A/B. The first and second reactant gases thus issues as a series of elongated curtain-like streams of gas from the respective first reactant gas outlets 144A/B and second reactant gas outlets 152A/B.

As the first and second reactant gases approach the rotating wafer carrier 120, the temperature of the reactant gases substantially increase and viscous drag of the rotating wafer carrier 120 impels the first and second gases into rotation about an axis of the wafer carrier 120, so that the gases flow around the axis and outwardly toward a perimeter of the wafer carrier 120 in a boundary region near the top surface of the wafer carrier 120. Depending on the reactant gases used in the process, pyrolyzation can occur in or near the boundary region at an intermediate temperature between that of the injector block 104 and the wafer carrier 120. This pyrolyzation facilitates the interaction of the reactant gases and growth of the crystalline structure. Non-deposited gas continues to flow toward the perimeter and over the outer edge of the carrier 120, where it can be removed from the process chamber 102 through one or more exhaust ports disposed below the wafer carrier 120.

In some embodiments, the first reactant gas emitted from the second zone 140B can include a higher concentration of Group III alkyl metals, relative to the first reactant gas emitted from the first zone 140A, and the second reactant gas second zone 151B—which can at least partially encircle the second reactant gas first zone 151A—can include a higher concentration of carrier gas relative to the second reactant gas first zone 151A. The increased concentration of Group III alkyl metals in the first reactant gas second zone 140B and the decreased concentration of Group V hydrides in the second reactant gas second zone 151B can serve to improve growth uniformity and promote a more efficient use of the reactant chemicals during the CVD process, thereby reducing production costs and improving quality.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions. Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

What is claimed is:

1. A circular injector block having an axis of symmetry coincident with a diameter of the circular injector block, the circular injector block for supplying one or more reactant gases into a chemical vapor deposition reactor comprising:

a first reactant gas flow path conduit in communication with one or more first reactant gas inlets;

a second reactant gas flow path conduit in communication with one or more second reactant gas inlets;

a plurality of first reactant gas distribution channels configured as linear channels in a portion of the circular injector block between the one or more first reactant gas inlets and a plurality of first reactant gas distribution outlets in direct fluid communication with the plurality of first reactant gas distribution channels such that each of the plurality of first reactant gas distribution outlets opens directly into the plurality of first reactant gas distribution channels to deliver a first reactant gas into the reactor, wherein the plurality of first reactant gas distribution channels is in fluid communication with the first reactant flow path conduit;

wherein the one or more first reactant gas inlets are in fluid communication with the first reactant gas flow path conduit in proximity to a perimeter of the circular injector block, the first reactant gas flow path conduit separated into a first arcuate channel defining a first reactant gas first zone configured to supply a first set of first reactant gas distribution outlets, and a second arcuate channel defining a first reactant gas second zone configured to supply a second set of first reactant gas distribution outlets; and a plurality of second reactant gas distribution channels between the one or more second reactant gas inlets and a plurality of second reactant gas distribution outlets to deliver a second reactant gas into the reactor, wherein the plurality of second reactant gas distribution channels is in fluid communication with the second reactant gas flow path conduit;

wherein the first reactant gas flow path conduit includes an annular channel positioned in proximity to the perimeter of the circular injector block, wherein the annular channel includes two or more dividers on a common side of the axis of symmetry and separating the first reactant gas flow path conduit into the first arcuate channel and the second arcuate channel, wherein the first arcuate channel has a first arcuate volume greater than a second arcuate volume of the second arcuate channel; and wherein, for a cross-sectional view of the circular injector block in a plane extending perpendicularly to the plurality of first reactant gas distribution channels, at least one second reactant gas distribution channel of the plurality of second reactant gas distribution channels and a corresponding second reactant gas distribution outlet of the at least one second reactant gas distribution channel are disposed to have a larger distance from a center of the circular injector block than the distance from the center of the circular injector block for each first reactant gas distribution outlet of the plurality of first reactant gas distribution outlets in the cross-sectional view;

wherein the plurality of second reactant gas distribution outlets is partitioned into at least a second reactant gas first zone and a second reactant gas second zone, the second reactant gas second zone at least partially surrounding the second reactant gas first zone;

wherein the first reactant gas flow path conduit and the second reactant gas flow path conduit are adjacent one another and a section of the first reactant gas flow path conduit and a section of the second reactant gas flow path conduit are both disposed radially outward from the at least one second reactant gas distribution outlet located in the second reactant gas second zone and from each of the first reactant gas distribution outlets.

2. The circular injector block of claim 1 wherein the one or more second reactant gas inlets includes a second reactant gas inlet for the second reactant gas second zone that is configured to supply the second reactant gas at a concentration different from that of the second reactant gas supplied to the second reactant gas first zone.

3. The circular injector block of claim 1 wherein the one or more second reactant gas inlets includes a second reactant gas inlet for the second reactant gas second zone that is configured to supply the second reactant gas at a concentration substantially equal to that of the second reactant gas supplied to the second reactant gas first zone.

4. The circular injector block of claim 1, wherein the second reactant gas second zone encircles the second reactant gas first zone.

5. The circular injector block of claim 1, wherein the second reactant gas distribution outlets of the second reactant gas first zone are alternately interspersed with the first reactant gas distribution outlets.

6. The circular injector block of claim 1, wherein the first reactant gas first zone has a larger number of first reactant gas distribution outlets than the first reactant gas second zone.

7. The circular injector block of claim 1, wherein flow rates of the first reactant gas first zone and the first reactant gas second zone are substantially equal.

8. The circular injector block of claim 1, wherein flow rates of the first reactant gas first zone and the first reactant gas second zone are different.

9. The circular injector block of claim 1, wherein the first reactant gas first zone and the first reactant gas second zone include separate first reactant gas inlets.

10. The circular injector block of claim 9, wherein the first reactant gas inlet for the first reactant gas second zone is configured to supply the first reactant gas at a concentration different from that of first reactant gas supplied to the first reactant gas first zone.

11. The circular injector block of claim 9, wherein the first reactant gas inlet for the first reactant gas second zone is configured to supply the first reactant gas at a concentration substantially equal to that of the first reactant gas supplied to the first reactant gas first zone.

12. A circular injector block having an axis of symmetry coincident with a diameter of the circular injector block, the circular injector block for supplying one or more reactant gases into a chemical vapor deposition reactor comprising:

a first reactant gas flow path conduit in communication with one or more first reactant gas inlets;

a second reactant gas flow path conduit in communication with one or more second reactant gas inlets;

a plurality of first reactant gas distribution channels configured as linear channels in a portion of the circular injector block between the one or more first reactant gas inlets and a plurality of first reactant gas distribution outlets in direct fluid communication with the plurality of first reactant gas distribution channels such that each of the plurality of first reactant gas distribution outlets opens directly into the plurality of first reactant gas distribution channels to deliver a first reactant gas into the reactor, wherein the plurality of first reactant gas distribution channels is in fluid communication with the first reactant flow path conduit;

wherein the one or more first reactant gas inlets are in fluid communication with the first reactant gas flow path conduit in proximity to a perimeter of the circular injector block, the first reactant gas flow path conduit separated into a first arcuate channel defining a first reactant gas first zone configured to supply a first set of first reactant gas distribution outlets, and a second arcuate channel defining a first reactant gas second zone configured to supply a second set of first reactant gas distribution outlets; and a plurality of second reactant gas distribution channels between the one or more second reactant gas inlets and a plurality of second reactant gas distribution outlets to deliver a second reactant gas into the reactor, wherein the plurality of second reactant gas distribution channels are in fluid communication with the second reactant gas flow path conduit;

wherein the first reactant gas flow path conduit includes an annular channel positioned in proximity to the perimeter of the circular injector block, wherein the annular channel includes two or more dividers on a common side of the axis of symmetry and separating the first reactant gas flow path conduit into the first arcuate channel and the second arcuate channel, wherein the first arcuate channel has a first arcuate volume greater than a second arcuate volume of the second arcuate channel; and wherein, for a cross-sectional view of the circular injector block in a plane extending perpendicularly to the plurality of first reactant gas distribution channels, at least one second reactant gas distribution channel of the plurality of second reactant gas distribution channels and a corresponding second reactant gas distribution outlet of the at least one second reactant gas distribution channel are disposed to have a larger distance from a center of the circular injector block than the distance from the center of the circular injector block for each first reactant gas distribution outlet of the plurality of first reactant gas distribution outlets in the cross-sectional view;

wherein the plurality of second reactant gas distribution outlets is partitioned into at least a second reactant gas first zone and a second reactant gas second zone, the second reactant gas second zone at least partially surrounding the second reactant gas first zone;

wherein the first reactant gas flow path conduit and the second reactant gas flow path conduit are adjacent one another and a section of the first reactant gas flow path conduit and a section of the second reactant gas flow path conduit are both disposed radially outward from the at least one second reactant gas distribution outlet located in the second reactant gas second zone and from each of the first reactant gas distribution outlets;

wherein the second reactant gas flow path conduit lies above the plurality of second reactant gas distribution channels, while the first reactant gas flow path conduit lies in a plane that intersects each of the first reactant gas distribution channels and each of the second reactant gas distribution channels.

13. The circular injector block of claim 12, wherein the one or more second reactant gas inlets includes a second reactant gas inlet for the second reactant gas second zone that is configured to supply the second reactant gas at a concentration different from that of the second reactant gas supplied to the second reactant gas first zone.

14. The circular injector block of claim 12, wherein the one or more second reactant gas inlets includes a second reactant gas inlet for the second reactant gas second zone that is configured to supply the second reactant gas at a concentration substantially equal to that of the second reactant gas supplied to the second reactant gas first zone.

15. The circular injector block of claim 12, wherein the second reactant gas second zone encircles the second reactant gas first zone.

16. The circular injector block of claim 12, wherein the second reactant gas distribution outlets of the second reactant gas first zone are alternately interspersed with the first reactant gas distribution outlets.

17. The circular injector block of claim 12, wherein the first reactant gas first zone has a larger number of first reactant gas distribution outlets than the first reactant gas second zone.

18. The circular injector block of claim 12, wherein flow rates of the first reactant gas first zone and the first reactant gas second zone are substantially equal.

19. The circular injector block of claim 12, wherein flow rates of the first reactant gas first zone and the first reactant gas second zone are different.

20. The circular injector block of claim 12, wherein the first reactant gas first zone and the first reactant gas second zone include separate first reactant gas inlets.

21. The circular injector block of claim 20, wherein the first reactant gas inlet for the first reactant gas second zone is configured to supply the first reactant gas at a concentration different from that of first reactant gas supplied to the first reactant gas first zone.

22. The circular injector block of claim 20, wherein the first reactant gas inlet for the first reactant gas second zone is configured to supply the first reactant gas at a concentration substantially equal to that of the first reactant gas supplied to the first reactant gas first zone.

23. The circular injector block of claim 12, wherein the second reactant gas flow path conduit is defined by an angled wall that separates the second reactant gas flow path conduit from the first reactant gas flow path conduit.

* * * * *